United States Patent [19]
Watrobski et al.

[11] Patent Number: 6,037,831
[45] Date of Patent: Mar. 14, 2000

[54] FUSIBLE LINK CIRCUIT INCLUDING A PREVIEW FEATURE

[75] Inventors: Thomas E. Watrobski, Penfield; Juan J. Becerra, Webster; Christopher R. Morton, Rochester, all of N.Y.

[73] Assignee: Xerox Corporation, Stamford, Conn.

[21] Appl. No.: 09/050,520

[22] Filed: Mar. 30, 1998

[51] Int. Cl.$^7$ .......................... H01H 37/76; H01H 85/00
[52] U.S. Cl. ........................................... 327/525; 327/526
[58] Field of Search ................................. 327/525, 526; 365/225.7, 96

[56] References Cited

U.S. PATENT DOCUMENTS

| | | | |
|---|---|---|---|
| 4,551,685 | 11/1985 | Kerns, Jr. et al. | 330/86 |
| 4,879,587 | 11/1989 | Jerman et al. | 357/55 |
| 5,025,300 | 6/1991 | Billig et al. | 357/51 |
| 5,075,690 | 12/1991 | Kneezel | 346/1.1 |
| 5,387,823 | 2/1995 | Ashizawa | 326/13 |
| 5,388,134 | 2/1995 | Douglass et al. | 377/25 |
| 5,467,113 | 11/1995 | Ishinaga et al. | 347/17 |
| 5,517,455 | 5/1996 | McClure et al. | 327/525 |
| 5,566,107 | 10/1996 | Gilliam | 365/225.7 |

*Primary Examiner*—Toan Tran
*Assistant Examiner*—Quan Tra
*Attorney, Agent, or Firm*—Tallam I. Nguti

[57] ABSTRACT

A fusible link circuit including a preview feature and a method for programming or calibrating therefore. The fusible link circuit includes a fusible link, including a threshold above which the fusible link will be forced to an open condition with the application of a threshold condition applied thereto and a circuit, coupled to the fusible link, including an input and an output, generating an output signal on the output in response to a signal being applied to the input, wherein the output signal provides an output state which simulates the open condition of the fusible link as a preview feature. The fusible link circuit includes the preview feature so that the output of any circuit, which must be calibrated, programmed, or have its output set to a predetermined value, can be simulated or previewed to determine whether the correct output is obtainable without destroying the fusible links.

10 Claims, 7 Drawing Sheets

FUSIBLE LINK CIRCUIT INCLUDING A PREVIEW FEATURE

CROSS-REFERENCE TO RELATED APPLICATION

Cross-reference is made to patent application Attorney Docket No. D/98025Q entitled "Liquid Ink Printhead Including a Programmable Temperature Sensing Device" being filed concurrently herewith, herein incorporated by reference.

FIELD OF THE INVENTION

This invention relates generally a circuit including a fuse programmable output and more particularly to a fusible link circuit including a fuse programmable output with a preview feature.

BACKGROUND OF THE INVENTION

Ink jet printers eject ink onto a print medium such as paper in controlled patterns of closely spaced dots. To form color images, multiple ink jet printheads are used, with each head being supplied with ink of a different color from an associated ink container. The printing system may be incorporated in either a carriage type printer or a pagewidth type printer. A carriage type printer, such as the type disclosed, for example, in U.S. Pat. No. 4,571,599 and U.S. Pat. No. Re. 32,572, generally include a relatively small printhead containing ink channels and nozzles. The contents of these patents are hereby incorporated by reference. The printhead is usually sealingly attached to an ink supply container and the combined printhead and container form a cartridge assembly which is reciprocated to print one swath of information at a time on a stationarily held recording medium, such as paper. After the swath is printed, the paper is stepped a distance equal to the height of the printed swath, so that the next printed swath will be contiguous therewith. The procedure is repeated until the entire page is printed. The pagewidth printer has a stationary printhead having a length equal to or greater than the width of the paper. The paper is continually moved past the pagewidth printhead in a direction normal to the printhead length at a constant speed during the printing process. An example of a pagewidth printer is found in U.S. Pat. No. 5,221,397, whose contents are hereby incorporated by reference.

A known problem with thermal ink jet printers is the degradation in the output print quality due to a change in the volume of ink ejected at the printhead nozzles resulting from fluctuations of printhead temperatures. These temperatures produce variations in the size of the ejected drops which result in the degraded print quality. The size of ejected drops varies with printhead temperature because two properties that control the size of the drops vary with printhead temperature: the viscosity of the ink and the amount of ink vaporized by a firing resistor when driven with a printing pulse. Printhead temperature fluctuations commonly occur at printer startup, during changes in ambient temperature, and when the printer output varies.

When printing text, gray scale images, and/or color images the darkness, contrast and color rendition may vary with printhead temperature To print text, graphics, or images of the highest quality, the printhead temperature must remain constant. In addition, not only must the printhead temperature remain constant, each of the printheads, either within a single printing machine or among a variety of machines must print consistently from printhead to printhead so that the printed output of such machines remains consistent. Consequently, the calibration of the temperature sensors among the various printhead must be performed.

Various printhead temperature controlling systems and methods are known in the prior art for sensing printhead temperature and using sensed temperature signals to compensate for temperature fluctuations or increases. Likewise, fuse programmable circuits and fusible links are also known.

In U.S. Pat. No. 4,551,685 to Kerns, Jr. et al., a programmable gain feedback amplifier is described. A decoding and programming circuit for receiving an input programming command signal is used to selectively blow, or open, the proper fuses to establish a desired signal attenuation in a described network. After programming, the gain of the amplifier circuit, which is related to the total attenuation of the network, is permanently set, and does not require the programming signal to be continuously applied.

U.S. Pat. No. 4,879,587 to Jerman et al., describes a fusible link. The fusible link comprises a semi-conductor substrate, an electrically insulating layer on the substrate, a pair of conductor elements on the surface of the insulating layer opposite the substrate, and a fuse conductor layer on the surface of the insulating layer opposite the substrate electrically connecting the conductor elements.

U.S. Pat. No. 5,025,300 to Billig et al., describes an integrated circuit including a conductive fusible link that may be blown by laser energy. A dielectric material covering the fuse is etched away to expose the fuse.

U.S. Pat. No. 5,075,690 to Kneezel discloses an analog temperature sensor for an ink jet printhead which achieves a more accurate response by forming the thermistor on the printhead substrate and of the same polysilicon material as the resistors which are heated to expel droplets from the printhead nozzles.

U.S. Pat. No. 5,387,823 to Ashizawa describes a fuse-programmable control circuit including a master control circuit with a first fusible link that controls the feeding of power to a fuse-programmable memory. If output of signals from the fuse-programmable memory is not required, the first fusible link is cut. If output of signals from the fuse-programmable memory is required, the first fusible link is left uncut and the fuse-programmable memory is programmed by cutting one fusible link in each of a number of pairs of fusible links.

U.S. Pat. No. 5,388,134 to Douglass et al describes an integrated circuit temperature detector using a temperature dependent oscillator to count up to a fixed number and thereby generate a time interval indicative of the temperature(a temperature to time interval converter).

U.S. Pat. No. 5,467,113 to Ishinaga et al. describes an ink jet recording head for discharging ink including heaters for warming a board and sensors for detecting the temperature of the board.

SUMMARY OF THE INVENTION

In accordance with one aspect of the present invention, there is provided a fusible link circuit including a preview feature. The fusible link circuit includes a fusible link, including a threshold above which the fusible link will be forced to an open condition with the application of a threshold condition applied thereto, and a circuit, coupled to the fusible link, including an input and an output, generating an output signal on the output in response to a signal being applied to the input, wherein the output signal provides an output state which non-destructively simulates the open condition of the fusible link as a preview feature.

Pursuant to another aspect of the present invention, there is provided a fusible link circuit including a preview feature, a resistive device, including a first terminal, a transistor, including a second terminal coupled to the first terminal, an input terminal, coupled to the resistive device and to the transistor, to receive an input signal, and an output terminal, coupled to the resistive device and to the transistor, generating an output signal in response to the input signal, the output signal including an output state which nondestructively simulates an open condition of the fusible link circuit as a preview feature.

In accordance with still another aspect of the invention, there is provided a fusible link circuit including a preview feature for simulating one or more open fusible links, including a plurality of input terminals, each of the plurality of input terminals respectively to receive a first input signal or a second input signal, a plurality of fusible links, each of the plurality of fusible links respectively coupled to the plurality of input terminals, each respectively including a threshold above which the fusible link will be forced to an open condition with the application of the first input signal applied through the respectively associated plurality of input terminals, and a plurality of output terminals, each of the plurality of output terminals being coupled to the plurality of fusible links, each of the plurality of output terminals transmitting an output signal including an output state which simulates the open condition of the respectively associated fusible link as a preview feature of one or more of the open fusible links.

Pursuant to another aspect of the present invention, there is provided a method of programming an electronic circuit, including an output terminal transmitting a desired output signal thereon, the electronic circuit including a fusible link circuit, including an input terminal and a fusible link, comprising the steps of applying an input signal to the input terminal, examining an output signal, generated in response to the applied input signal, at the output terminal, comparing the examined output signal to the desired output signal to determine whether the examined output signal corresponds to desired output signal, and applying a forcing signal to the input terminal to force the fusible link to an open condition if the comparing step indicates that the examined output signal corresponds to the desired output signal.

While the present invention will be described in connection with a preferred embodiment thereof, it will be understood that it is not intended to limit the invention to that embodiment. On the contrary, it is intended to cover all alternatives, modifications, and equivalents as may be included within the spirit and scope of the invention as defined by the appended claims.

DETAILED DESCRIPTION OF THE INVENTION

Figure 1:
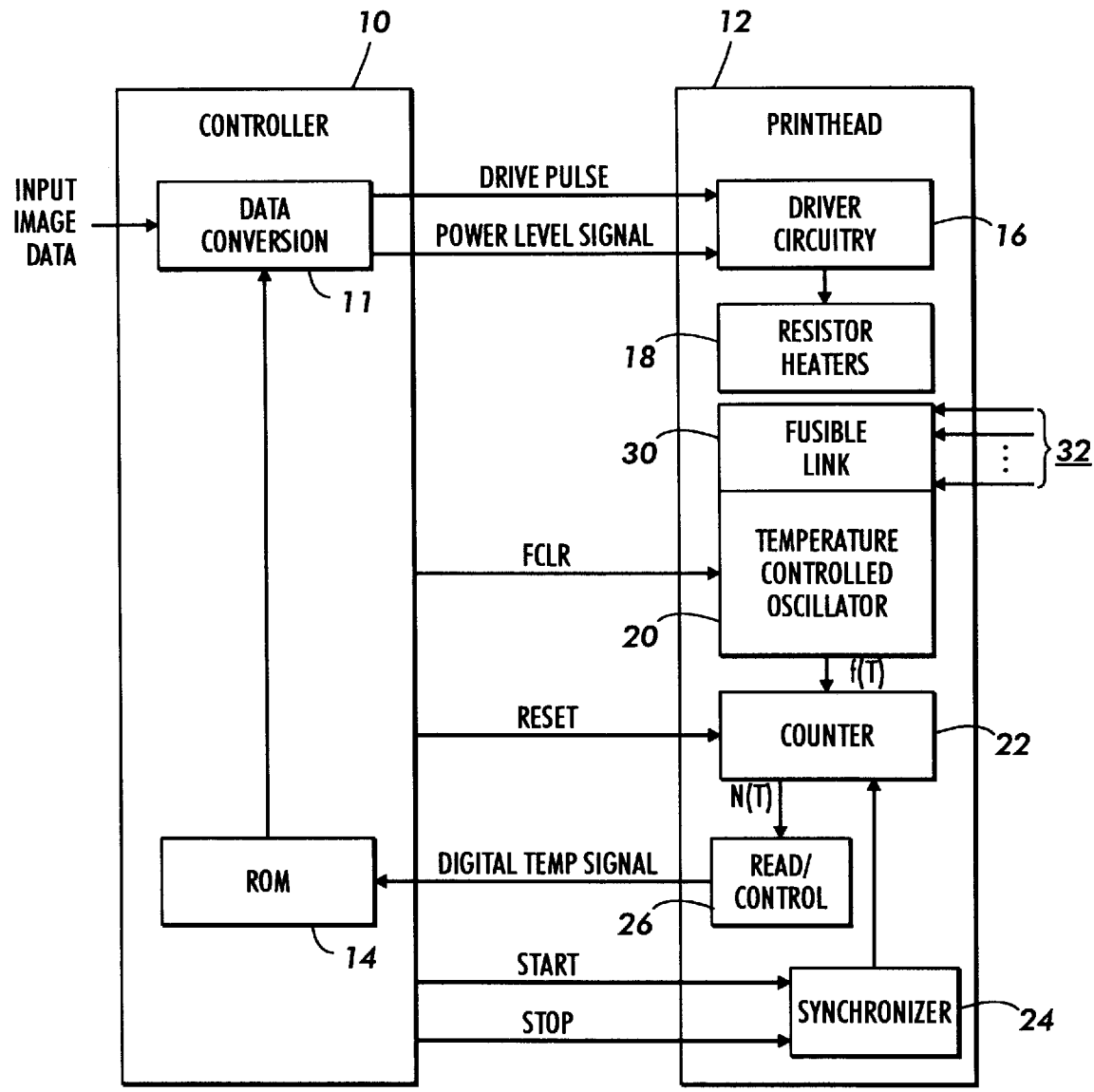
FIG. 1 illustrates an electrical block diagram showing circuitry for sensing changes in printhead temperature including a programmable fusible link circuit of the present invention.

Referring now to FIG. 1, there is shown a simplified block diagram of a portion of a thermal ink jet printer that employs a fusible link circuit and temperature sensing techniques of the invention. The invention can be used in a printer of the type disclosed in U.S. Pat. No. 4,980,702 and U.S. Pat. No. Re. 32,572, modified according to the principles of the invention is described below. These patents are hereby incorporated by reference. A controller 10 receives input image data signals from an image data source such as a computer (not shown). The controller processes the print data in a data conversion circuit to provide print control information to a printhead 12. Controller 10 conventionally comprises a CPU, a ROM 14 for storing programs and a RAM. The controller, besides performing the temperature sensing and correction functions described below, also controls operation of the print carriage on which printhead 12 is mounted, the movement of the recording medium as well as system timing functions.

Controller 10 sends heater resistor drive pulses and power level signals to driver circuitry 16 which can be formed on the printhead 12 substrate as shown or can alternatively be in the controller. Driver 16 comprises a plurality of driver transistors for applying the drive signals to associated resistor heaters 18. Driver 16 also includes a plurality of power transistors to control the power level of the drive signals applied to the resistor heaters. It is understood that the drive and power level signals could be applied directly from controller 10 via flexible electric wire cables, as is conventional in the art.

As a print operation is initiated, a scanning carriage carrying printhead 12 is moved back and forth in a scan path with ink being ejected through printhead nozzles when associated resistor heaters are pulsed by signals from driver circuitry 16. As print operation continues, the temperature of printhead 12 may begin to rise affecting the volume of ink being expelled from the nozzles and resulting in increased spot size of the ink ejected onto the recording sheet. A temperature controlled oscillator 20 is located on the printhead 12 substrate in a location which experiences the temperature variations of the printhead. Oscillator 20 is enabled by a function clear (FCLR) signal from controller 10 and begins to generate a train of output pulses whose frequency is temperature dependent. It can also include a freerunning, i.e. non-gated clock.

Referring to FIG. 1, the oscillator 20 produces a periodic signal, for instance including rectangular, triangular, or sinusoidal waveforms, during the time that FCLR is maintained high. These output pulses, of a relatively high amplitude of 3–5 v, are sent to a counter 22. The counter 22 need not be located at the printhead, but can be located elsewhere, for instance, at the controller 10. The counter is enabled by a start signal from a sequencer (state machine) in controller 10 as applied through a synchronizer circuit 24. The function of the synchronizer circuit is to synchronize the timing operation and prevent the counter from metastabilizing. During the start and stop periods, counter 22 accumulates (counts) the number of pulses occurring during the predetermined period initiated by the start signal and terminated by a stop signal. The contents of counter 22 are clocked out, as N(T) in read control logic circuit 26. The digital output of read/control circuit is a direct binary representation of the printhead temperature. Further description of the oscillator may be found in U.S. patent application Ser. No. 08/570, 024, allowed Aug. 19, 1997, herein incorporated by reference.

The frequency and period of the TCO varies with the temperature (as the TCO name suggests) of the sensing elements integrated in that circuit. In order for the electronics subsystem (ESS) in an IOT to adjust the proper energy applied to a given TIJ die module for a given temperature, it assumes that the temperature of that die is represented by the same analog quantity (TCO period) in every instance. For example, the ESS measuring the output period of the integrated TCO at 550 ns may consult a lookup table to determine a die module temperature of 35° C. If the TCO period measures 600 ns, another consultation of the lookup table may reveal a die module temperature of 25° C.

The digital temperature signal or a digital word or byte, representing printhead temperature, is sent to ROM 14. ROM 14 is loaded with look-up tables which correspond to the temperature sensitive characteristics for resistor heater 18. Processor 10 reads the digital word representative of the sensed printhead temperature and "looks up" the suitable combination of pulse duration and power level to be applied to driver circuitry 16 to compensate for the effects of the temperature change. Further details of loading of ROM 14 are found in U.S. Pat. No. 5,223,853, referenced supra.

According to one feature of the invention, the sensing period can be any time during print operation, even during a print swath, and is not limited to generation of temperature control signals only at the end of a print swath.

As further illustrated in FIG. 1, a fusible link circuit 30 is illustrated and is electrically coupled to the temperature controlled oscillator. As described, the temperature controlled oscillator generates a periodic signal whose frequency is temperature dependent. The output of the temperature controlled oscillator, however, can vary due to variations in manufacturing processes used to form the temperature controlled oscillator 20 on the printhead. Consequently, the fusible link circuit is used to adjust the original output of the temperature controlled oscillator so that the adjusted temperature controlled oscillator accurately provides an output which is related to the temperature sensors of the temperature controlled oscillator. Consequently, by including a fusible link circuit in the temperature controlled oscillator, the output can be adjusted such that the output values thereof are consistent from printdie to printdie, printhead to printhead and from printer to printer.

Figure 2:
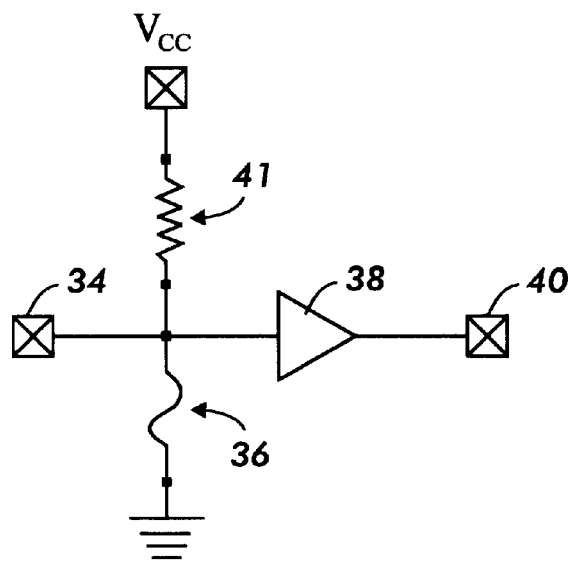
FIG. 2 illustrates a fusible link circuit of the prior art.

To adjust the output value of the temperature controlled oscillator 20, the fusible link circuit includes a plurality of inputs 32 which receive input signals for adjusting the output signal f(T). One example of a prior art fusible link circuit is illustrated in FIG. 2. The prior art fusible link circuit includes a blow input 34 which is coupled to a fusible element 36 which includes one end thereof coupled to a ground and the other end thereof attached to a buffer 38, the output of which is a buffer logic output 40. A resistor 41 is coupled between a voltage supply $V_{cc}$ and the input to the buffer 38. In this circuit, when an input signal is input to the blow input 34 and includes a sufficient amount of power, the fusible element 36 is blown or forced to an open condition.

In response thereto, the logic output at the output 40 is established at a supply voltage $V_{cc}$. If, however, the fusible element 36 is left intact, then the buffer logic output 40 is driven low due to the connection to ground.

In this type of prior art circuit, the output signal present on the buffer logic output 40 is entirely dependent on the state of the fusible link 36 without regard to an input signal to the input 34. For instance, if a signal applied to the blow input 34 is insufficient to force the fusible element 36 to an open condition, then the output on the buffer logic output 40 would be a value of approximately zero. If, however, the buffered logic output 40 is to be driven to a high level, dependent upon the supply voltage $V_{cc}$, then the fusible element 36 will be forced to an open condition by the input signal at the blow input 34. Consequently, the prior art fusible link circuits suffer from the fact that the output of such circuits is totally dependent upon the state of the fusible element 36. In such configurations, simulating a blown fusible element is not possible since the output level at output 40 is totally dependent on the physical state of the fusible link. Consequently, if after destroying the fusible element 36, it is found that the fusible element should not have been forced to an open condition, it is impossible to repair the fusible element, particularly in an integrated circuit, to achieve the previous state.

Figure 3:
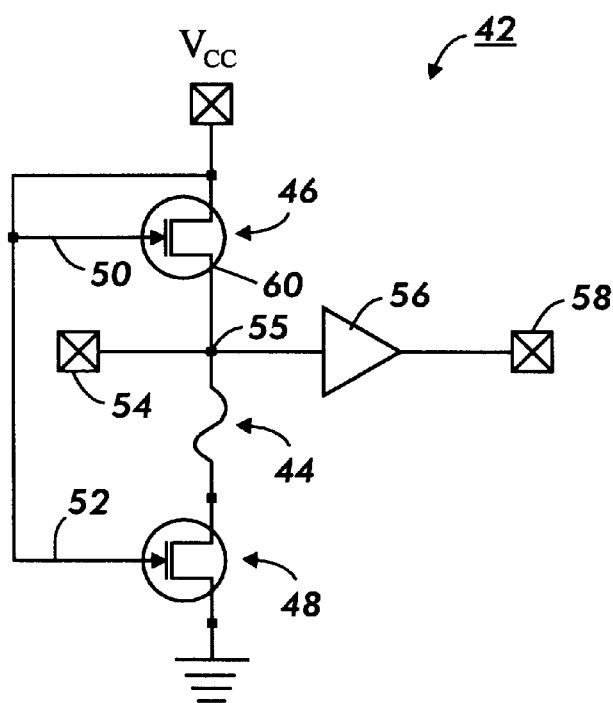
FIG. 3 illustrates a fusible link circuit of the present invention.

FIG. 3 illustrates one embodiment of the present invention. A fusible link circuit 42 is illustrated which includes a preview feature to allow for the simulation of the state of a fusible link 44, which corresponds to either an open condition or an intact state, by using "normal" input logic voltage levels. The fusible link circuit 42 includes a resistive device, such as a first field effect transistor 46, and a switching device such as a second field effect transistor 48 each of which have respective gates 50 and 52 coupled together and to a supply voltage $V_{cc}$. The resistive device can include a resistor having a resistance as well as the transistor 46 as illustrated. An input terminal 54 receives an input signal which is transmitted to a common node connecting the first transistor 46 to the second transistor 48 through the fuse 44. A buffer 56 is coupled to the node 55 and provides a buffering or isolating function between the input 54 and an output 58.

As illustrated in FIG. 3, the two transistors 46 and 48 act as a resistive divider with respective on-resistances or resistances/on-resistances selected such that the bottom leg of the circuit including the fusible link 44 and the transistor 48 is less resistive than the upper leg including the transistor 46. In one embodiment, the transistor 46 is to be five times more resistive than transistor 48. If a resistor is used the ratio would remain the same. Consequently, a source terminal 60, coupled to the output buffer 56, is at a low enough voltage so that the buffered output at the output 58 is set to a logic "zero" state when no input is applied to the input 54. This state corresponds to the situation when the fusible link is left intact. If, however, an input signal is applied to the input pad 54 and includes a significantly high voltage level, then the buffered output signal at the output 58 is forced to a logic "one" which corresponds to the fusible link 44 being forced to an open condition. The circuit is designed such that at "normal" voltage levels, (approximately 3.0 to 5.0 volts, for example, in nominal 5VTTL and CMOS logic circuits), the integrity and reliability of the circuit elements are not compromised. To force the output to a logic zero level, the input signal applied to the input 54 can be either left floating, as previously described, or a low logic voltage level can be applied to guaranty an output voltage level of zero.

The output terminal 58 of the present embodiment is coupled to the TCO circuit 20 of FIG. 1 such that a blown state or an intact state of the fusible link 44 can be simulated by applying an input signal of the described levels to the input 54. Consequently, the present invention is capable of non-destructively simulating either blown or intact states of one or more fusible elements of an electronic circuit.

Such fusible links, however, are not limited to the application of the temperature controlled oscillator 20 but are also applicable to a variety of known circuits including integrated circuits. Functions such as logic network synthesis in ASICs, encoding or inscription of serial numbers, passwords, or electronic "combination lock" data, and storage of performance data in a product measured prior to reaching an end user. In such known circuits, whether or not a given fusible link is to be forced to an open condition or left intact is typically determined independently of the fuse element itself. For example, in programmable logic devices, a synthesized logic network is realized by blowing or forcing to an open condition the required fuses based on algorithms generated by a compiler. A serial number is a known digital quantity which is encoded into a device. A device's measured output power can be represented by a digital quantity encoded in a plurality of fusible elements. In these cases, the typical configuration of a fusible link circuit is described by a fuse element located between a ground node and a "blow" node as shown in the prior art illustration of FIG. 2. In these configurations, simulating a blown fuse is not possible since "normal" logic voltage applied to the input would destroy the fuse element.

The present invention, however, provides for the observation of a measurement or changes in a circuit's behavior by simulating either blown or intact fuses by applying high or low input logic levels at normal voltage levels for each of the different combinations of fuses. The measured values of the circuit's behavior over the combinations of the simulated fuse states can then be compared to a predetermined reference value. The combination of blown and intact fuses associated most closely with the desired reference output signal can be permanently written or programmed into a circuit by applying a voltage input level in excess of normal logic voltages, sufficient to destroy the fusible element or elements associates with the desired blown states but low enough as not to damage the other remaining circuit elements.

Figure 4:
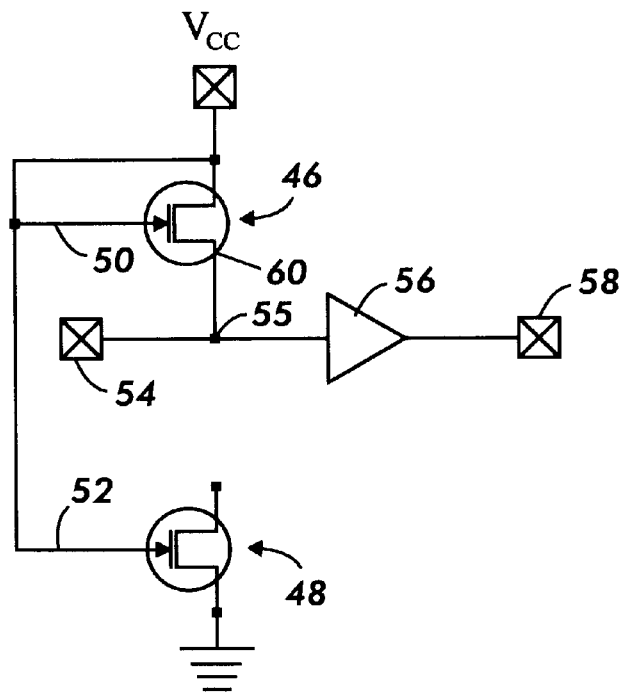
FIG. 4 illustrates the fusible link circuit of FIG. 3 wherein the fusible link has been forced to an open condition.

Once it has been determined as to which of the desired output states are to be generated at the output 58, to correspond to an open or blown fusible link 44, a voltage sufficient in amplitude and duration to destroy the fusible element 44 is applied to the input 54. This input signal should include an amplitude which is low enough so as not to damage the upper transistor 46, in the case of a transistor, and the input to buffer 56. The lower transistor 48 enters an avalanche breakdown mode causing an effective short circuit which in turn destroys the fusible link. or the output buffer 56. The voltage applied to the drain via the node 54 should include a sufficiently high current to melt or to force open the fusible element 44, which is illustrated in FIG. 4, since the fusible element has been destroyed by a sufficiently high input amplitude signal. It has been found that a input signal of approximately 13–15 volts is sufficient to open or to destroy the fusible link without damaging other components.

Figure 5:
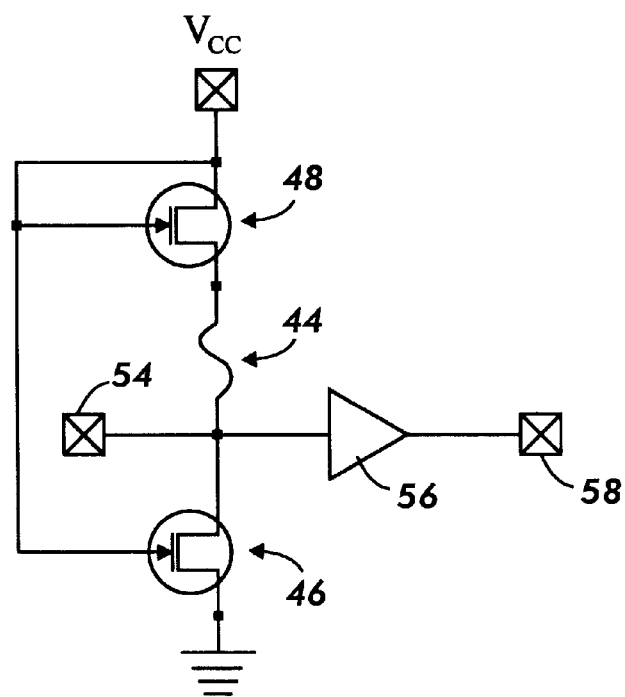
FIG. 5 illustrates another embodiment of the fusible link circuit of the present invention.

FIG. 5 illustrates another embodiment of the present invention with the location of individual transistors changed so that an input signal of 5 volts applied to the input generates an output of a logic one for the purposes of simulating a blown fusible link. The numbering remains the same as in FIGS. 3 and 4 since the components are the same, but the location of each of the transistors as well as of the fusible link has been changed as illustrated. The transistor 46, as before, has its transconductance selected to be five times the transconductance of the transistor 48. To achieve the non-destructive simulation of output states, an input signal of zero volts would generate an output of a logic zero. The fusible link is forced to an open condition when a voltage of negative 10 volts or less is applied to the input. Consequently, when the fuse is intact and the input is left floating, the output is a logic zero and when the fuse is blown and the input is left floating, the output is a logic one.

Figure 6:
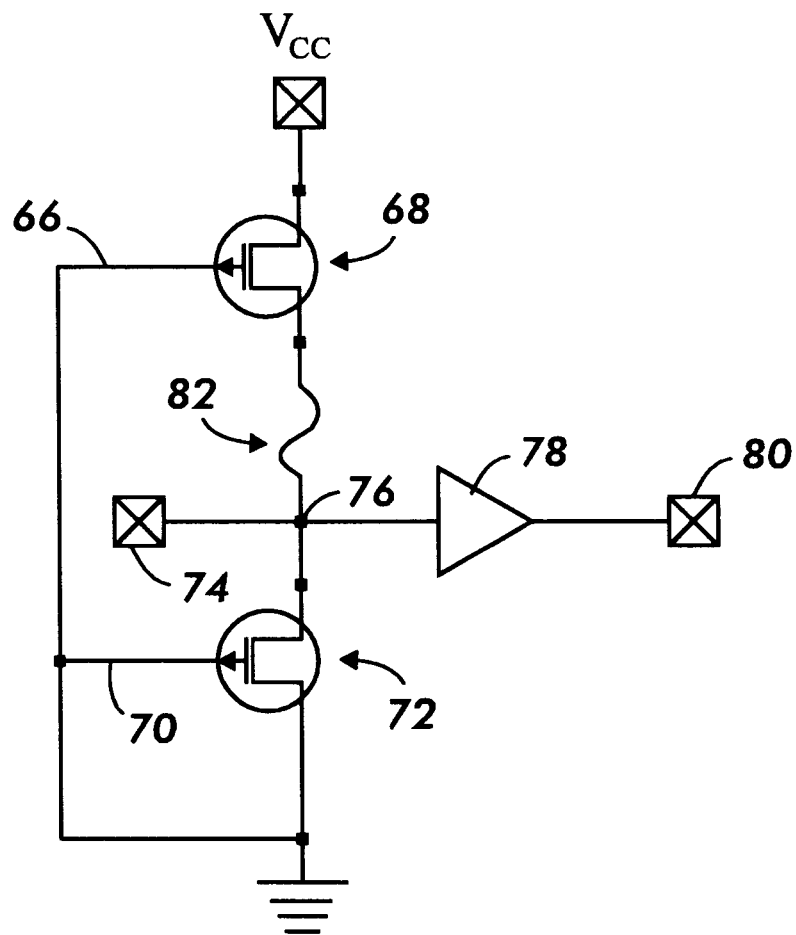
FIG. 6 illustrates another embodiment of the fusible link circuit of the present invention.
Figure 7:
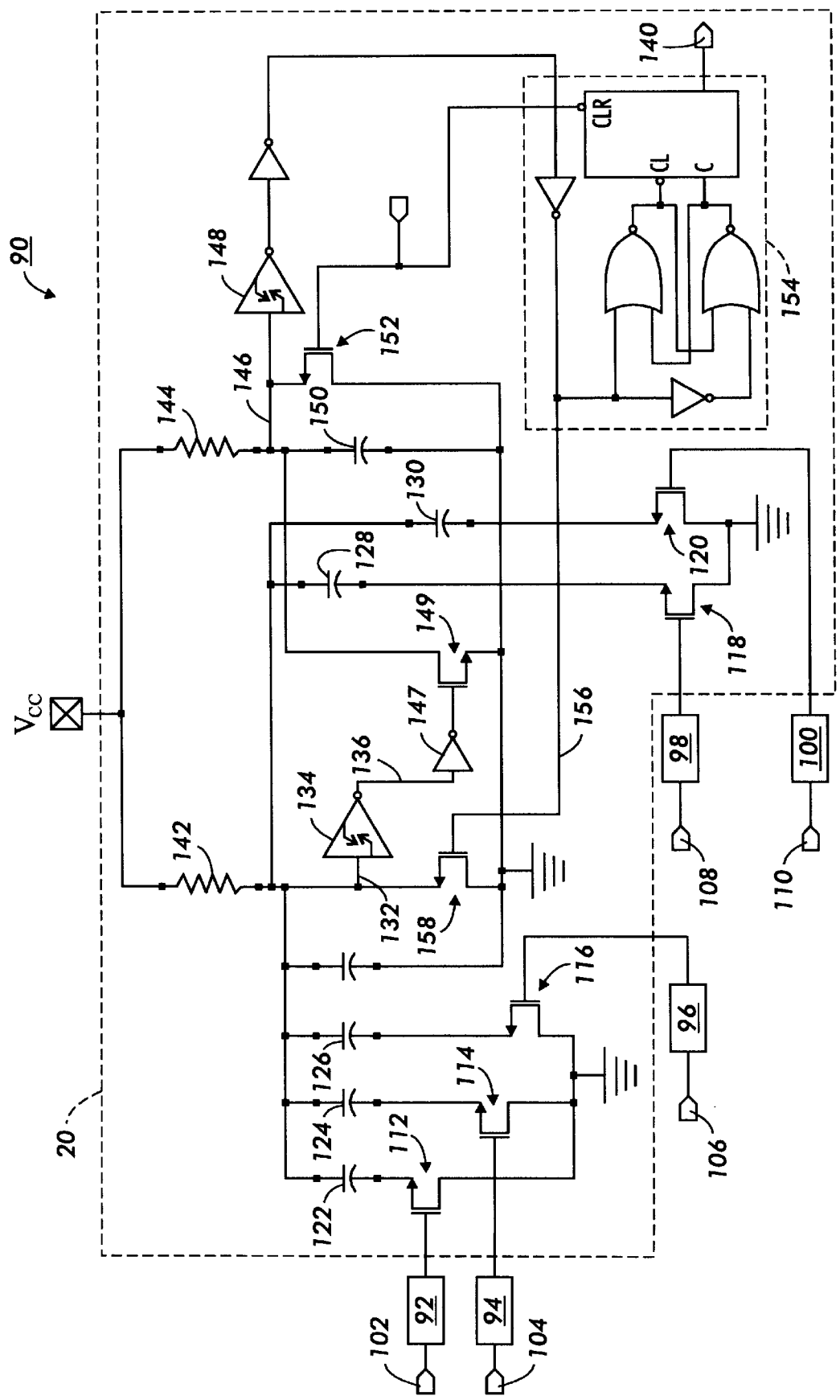
FIG. 7 illustrates a temperature controlled oscillator incorporating a plurality of fusible link circuits of the present invention.

While the embodiments of FIGS. 3, 4, and 5 include NMOS transistors, FIG. 6 illustrates another embodiment of the present invention which includes PMOS transistors. As illustrated, a ground connection is made respectively to a gate 66 of a first transistor 68 and a gate 70 of a second transistor 72. An input terminal 74 is coupled to a common node 76 which is connected to a buffer 78 having an output connected to an output terminal 80. A fusible link 82 is coupled between the transistor 68 and the node 76. As with the embodiment of FIG. 4, a sufficiently high input voltage level can be applied to the input terminal 74 to force the fusible link 82 to an open condition FIG. 7 illustrates a tunable temperature controlled oscillator (TCO) circuit of the present invention. The TCO circuit 90 is connected to a first, second, third, fourth and fifth fusible link circuits 92, 94, 96, 98, and 100 respectively. Each of the fusible link circuits is embodied as one of the previously described fusible link circuits, such as in FIGS. 3,5, and 6. A single accessible test input terminal 102, 104, 106, 108, and 110, is coupled respectively to each of the associated fusible link circuits. Each of the test input terminals is coupled to one of the input terminals of a fusible link circuit, for instance, input terminal 54 of FIG. 3. Each of the fusible link circuits includes an output terminal 58, as previously described, which is coupled to the gate of an associated MOS transistor 112, 114, 116, 118, and 120 respectively. Each of the MOS transistors 112, 114, 116, 118 and 120 is respectively coupled to an associated capacitor 122, 124, 126, 128, and 130. These five capacitors are also coupled to an input 132 of a Schmitt trigger 134. An output signal on a Schmitt trigger output 136 is determined, at least in part, by the present or absent state of each of the capacitors 122, 124, 126, 128, and 130, the state of which is determined by the simulated or actual state of the fusible link circuit of each of the respectively associated fusible link circuits 92, 94, 96, 98, and 100.

Figure 9:
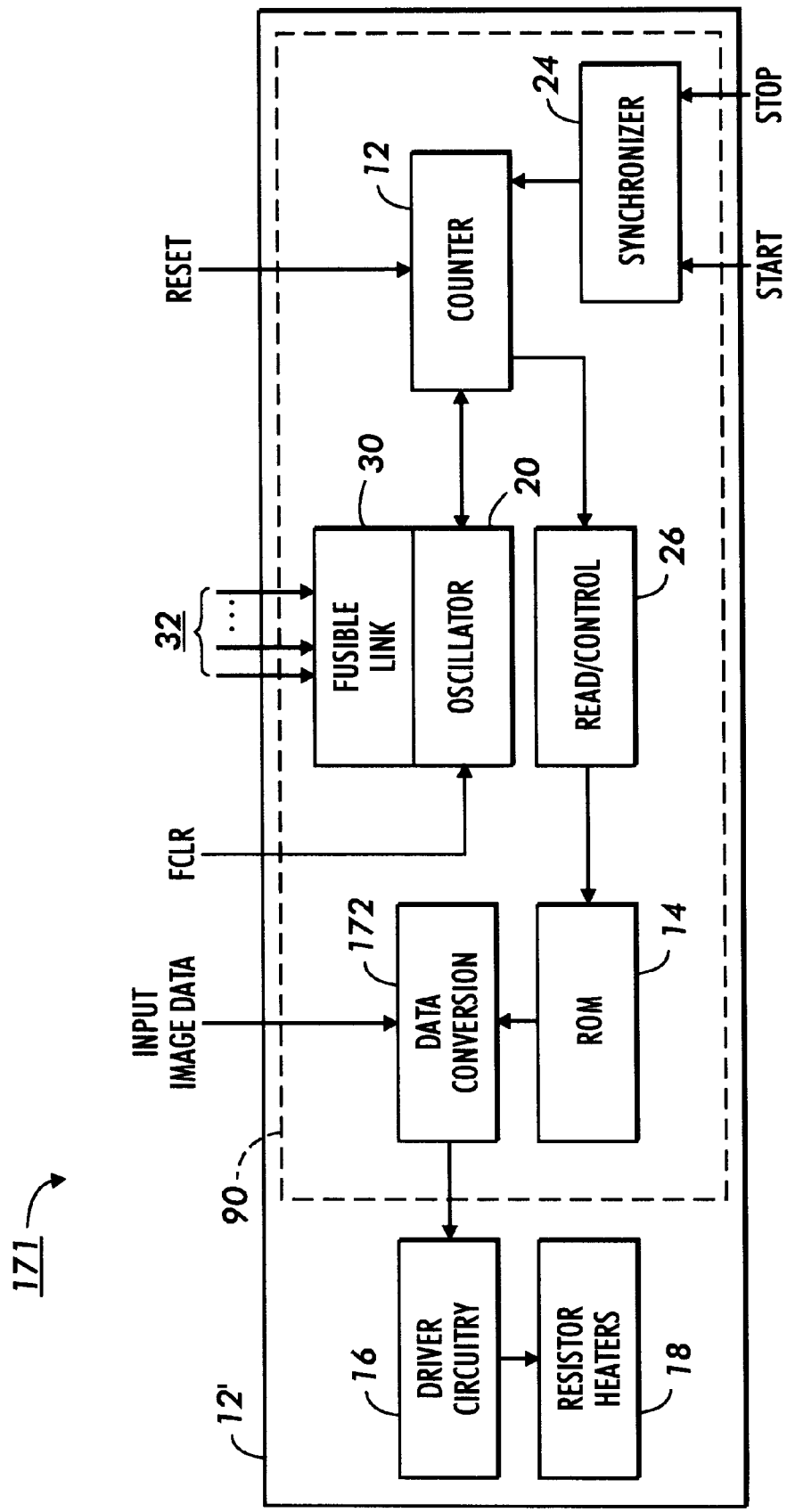
FIG. 9 illustrates an alternate embodiment of FIG. 1 wherein all temperature sensing circuits are formed on a single integrated circuit chip on the printhead.

As previously described with respect to the fusible link circuits of FIGS. 3,5, and 9, the output thereof can be determined by either the application of an input signal to the input to simulate a fusible link which is either forced to an open condition or which is intact, or the output thereof can be established permanently by applying a voltage level to the respective inputs as previously described.

The TCO circuit is tuned according to a predetermined reference value which is compared to an output signal at an output 140. The TCO circuit includes a first temperature sensing resistor 142 coupled between a voltage supply $V_{cc}$ and the input 132 of the Schmitt trigger 134 and a second sensing resistor 144 which is coupled to an input 146 of a second Schmitt trigger 148 which receives an output from output 136 through NOT gate 147 and transistor 149. The second Schmitt trigger 148, in this embodiment, includes a capacitor 150 coupled between the input 146 and ground and an NMOS transistor 152 also coupled between the input 146 and ground. A divider circuit 154 includes an output 156 coupled to an NMOS transistor 158 which is used to establish the frequency at the output 140 by dividing the internal circuit frequency by two utilizing the illustrated NOR gates, an inverter and a counter, also known as a flip-flop or a decimal 2 counter.

While the circuit 90 is designed to generate a signal at the output 140 including a predetermined frequency which is indicative of the sensed temperatures, due to the variations of integrated circuit fabrication, the output 140 must be determined and tuned, if necessary, with respect to the predetermined reference signal. Consequently, the output 140 may be adjusted, if necessary, by applying five input signals simultaneously to the inputs of the fusible link circuits and then varying the logic state of each of the inputs such that a range of outputs can be generated which are then compared to the predetermined value at the output 140.

Figure 8:
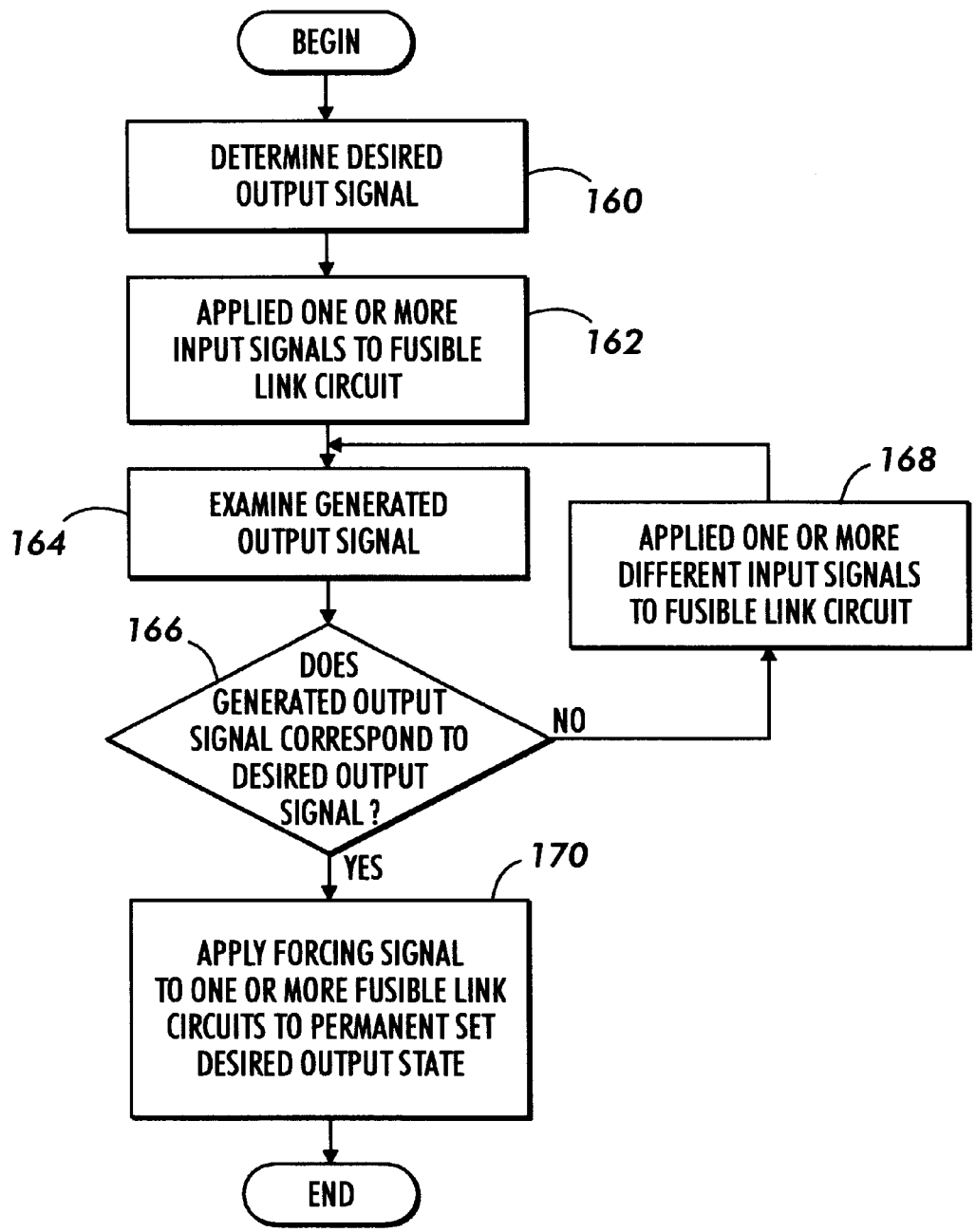
FIG. 8 illustrates a flowchart of a programming operation for the fusible link circuit and programmable temperature sensing device of the present invention.

As illustrated in FIG. 8, a flow chart for establishing the operating characteristics of a circuit including fusible links begins with determining a desired output signal at step 160. At step 162, one or more input signals are applied to the fusible link circuit which, as described, can include each of the fusible link circuits 92, 94, 96, 98, and 100. If for instance, no signal or a low level signal is applied to the input 102 then the output at the fusible link circuit 92 would be a logic '0' output level, since the transistor 48 of FIG. 3 is conducts more strongly than transistor 60 of FIG. 3 due to the designed ratio between the two transistors. The transistor 112 is then left off, and the capacitor 122 is electrically absent in the input circuit to the Schmitt trigger 134. If, however, the input signal at the input 102 is sufficiently high, then the state of transistor 48 at FIG. 3 is inconsequential as the overriding input signal sets the output to a logic '1', thereby turning on transistor 112. The capacitor 122 is electrically present in the input circuit to the Schmitt trigger 134.

Since the outputs of each of the fusible link circuits can be simulated by applying inputs thereto, a signal is applied to each of the inputs and an output signal generated at the output 140 as examined at step 164 which is compared to the desired output signal at step 166. If the generated output signal does not correspond to or match the desired output signal, then a second set of input signals is applied to each of the fusible link circuits to generate a new output signal at step 168. For instance, the first set of input signals might be no input signals to each of the fusible link circuits. A second set of input signals might include a high level signal applied to only the fusible link circuit 100. In this fashion, a different set of input signals are established such that the number of combinations of inputs would be equal to $2^N$ where N equals the number of input terminals, or five as in the described circuit 90 of FIG. 7. Once the generated output signal corresponds to the desired output signal as determined at step 166, then appropriate forcing signals are applied to one or more of the fusible link circuits to program the fusible link circuits to permanently set the desired output state at step 170. As an example, if it is determined that the fusible link circuit 100 is the only circuit among the five fusible link circuits which has been determined have its fusible link forced to an open condition, then a sufficiently high input signal is applied to the input 110 to force the fusible link circuit to an open condition. As such, the capacitor 130 is placed in the input circuit to the Schmitt trigger 134.

Due to variations in the many steps involved in the fabrication of TIJ heater wafers, variations in the native frequency of the TCOs from die-to-die, wafer-to-wafer, and lot-to-lot, are wide enough to require tuning, or calibration, of that circuit. The plurality of appropriately sized capacitors, each linked to a "hunt and blow" circuit, allows a near-linear tuning capability of the TCO period. A test device (during wafer probe or post-printhead cartridge assembly, for example) would cycle through all $2^N$ simulated open/blown combinations of the plurality of inputs to arrive at the closest match to the reference standard. The associated states corresponding to the correct output TCO period are then written into the chip as described previously.

While the embodiments disclosed herein are preferred, it will be appreciated from this teaching that various alternative modifications, variations or improvements therein may be made by those skilled in the art. For example, the embodiments of the invention shown in FIG. 1 discloses printhead 12 containing the circuitry used to implement the temperature sensing function (oscillator 20, counter 22, read/control 26 and synchronizer 24) formed on the printhead substrate. The look-up and pulse generation adjustment are accomplished using circuitry in the controller 10 FIG. 8 shows a printhead 12 modified so that all of the above-described functions are formed on a single integrated circuit chip 170 on the printhead; e.g., chip 171 contains data conversion 172, oscillator 20, fusible link circuit 30, counter 12, synchronizer 24, read/control 26 and ROM 14. Total integration of the temperature sensing function is thus enabled. However, part and parcel of the circuits and sub-circuits may be included on either or both the controller (10) and printhead (12).

While this invention has been described in conjunction with a specific embodiment thereof, it is evident that many alternatives, modifications, and variations will be apparent to those skilled in the art. For instance, the present invention is not limited to the embodiments shown, but is applicable to any fusible link circuit useful for programming or establishing the output of an electronic circuit. In addition, the present invention while being described with regards to a thermal ink jet printhead, is not limited thereto, as the present invention includes applications other than to the described temperature controlled oscillator. In addition, the present invention, is not limited to an integrated circuit embodiment including the described fabricated transistors but can include other types of electrical circuits. Accordingly, it is intended to embrace all such alternatives, modifications and variations that fall within the spirit and broad scope of the appended claims.

What is claimed is:

1. A fusible link circuit including a preview feature, comprising:

a fusible link, including a threshold above which said fusible link will be forced to an open condition with the application of a threshold condition applied thereto; and a circuit including a switching device comprising a first transistor coupled to said fusible link, said circuit including an input coupled to said first transistor and to said fusible link, and an output, and said circuit generating an output signal on said output, in response to a signal being applied to said input, for providing an output state which non-destructively simulates an open condition of said fusible link as a preview feature.

2. The fusible link circuit of claim 1, wherein said circuit comprises an integrated circuit.

3. The fusible link circuit of claim 1, comprising a resistive device coupled to said fusible link wherein said first transistor and said resistive device includes a resistance different from an on-resistance of said switching device.

4. The fusible link circuit of claim 3, wherein said resistive device comprises a second transistor, having an on-resistance different from an on-resistance of said first transistor.

5. A fusible link circuit including a preview feature, comprising:
- a resistive device, including a first terminal, a transistor, including a second terminal coupled to said first terminal,
- a fusible link coupled to said resistive device and to said transistor, and including a threshold above which said fusible link will be forced to an open condition;
- an input terminal, coupled to said fusible link and to said transistor, for receiving an input signal; and
- an output terminal, coupled to said fusible link and to said transistor for generating an output signal in response to said input signal, said output signal including an output state which non-destructively simulates an open condition of said fusible link as a preview feature.

6. The fusible link circuit of claim 5, wherein coupled elements comprise an integrated circuit.

7. The fusible link circuit of claim 6, wherein said transistor includes an on-resistance and said resistive device includes a resistance f different in value from said on-resistance.

8. The fusible link circuit of claim 7, wherein said resistive device and said transistor comprise a resistance divider.

9. A tunable temperature controlled (TCO) circuit including a fusible link circuit having a preview feature for non-destructively simulating a number of open fusible links, the (TCO) circuit comprising:
- a plurality of input terminals, wherein each input terminal of said plurality of input terminals receives one of a first input signal and a second input signal,
- a plurality of transistors;
- a plurality of fusible links, each fusible link of said plurality of fusible links being respectively coupled to a transistor of said plurality of transistors, and to an input terminal of said plurality of input terminals, and said each fusible link respectively including a threshold above which said each fusible link will be forced to an open condition with application of said one of said first input signal and said second input signal applied through a respectively associated input terminal; and
- a plurality of output terminals, each input terminal of said plurality of output terminals being coupled to said plurality of fusible links, and transmitting an output signal including an output state which simulates open condition of a respectively associated fusible link as a preview feature of one or more of said fusible links.

10. The (TCO) circuit of claim 9, wherein each of said plurality of fusible links is coupled to a resistive device including a first terminal, and to a said transistor including a second terminal coupled to said first terminal.

* * * * *